United States Patent
Matsushima

(10) Patent No.: US 11,634,581 B2
(45) Date of Patent: Apr. 25, 2023

(54) THERMALLY CONDUCTIVE RESIN COMPOSITION AND THERMALLY CONDUCTIVE SHEET USING THE SAME

(71) Applicant: DEXERIALS CORPORATION, Shimotsuke (JP)

(72) Inventor: Masayuki Matsushima, Shimotsuke (JP)

(73) Assignee: DEXERIALS CORPORATION, Shimotsuke (JP)

(*) Notice: Subject to any disclaimer, the term of this patent is extended or adjusted under 35 U.S.C. 154(b) by 0 days.

(21) Appl. No.: 17/617,845

(22) PCT Filed: Apr. 5, 2021

(86) PCT No.: PCT/JP2021/014460
§ 371 (c)(1),
(2) Date: Dec. 9, 2021

(87) PCT Pub. No.: WO2021/220724
PCT Pub. Date: Nov. 4, 2021

(65) Prior Publication Data
US 2022/0254701 A1 Aug. 11, 2022

(30) Foreign Application Priority Data
Apr. 27, 2020 (JP) .............................. JP2020-078248

(51) Int. Cl.
*C08L 83/04* (2006.01)
*C08K 3/28* (2006.01)
*H01L 23/373* (2006.01)
*C08K 3/22* (2006.01)

(52) U.S. Cl.
CPC ............... *C08L 83/04* (2013.01); *C08K 3/28* (2013.01); *H01L 23/3737* (2013.01); *C08K 2003/222* (2013.01); *C08K 2003/2227* (2013.01); *C08K 2003/282* (2013.01); *C08K 2201/001* (2013.01)

(58) Field of Classification Search
CPC combination set(s) only.
See application file for complete search history.

(56) References Cited

U.S. PATENT DOCUMENTS 6,448,329 B1 * 9/2002 Hirschi .................. C08L 83/04
524/588

FOREIGN PATENT DOCUMENTS

| CN | 111019357 A | * | 4/2020 |
|----|---|---|---|
| EP | 823451 A1 | * | 2/1996 |
| JP | H09-118818 A | | 5/1997 |
| JP | 2012-069783 A | | 4/2012 |
| JP | 2012-233099 A | | 11/2012 |
| JP | 2013-086433 A | | 5/2013 |
| JP | 2016-030774 A | | 3/2016 |
| JP | 6008706 B2 | | 10/2016 |
| JP | 2017-125138 A | * | 7/2017 |
| JP | 6194861 B2 | | 9/2017 |
| WO | WO 2010/107516 | * | 5/2010 |
| WO | 2017-002474 A1 | | 1/2017 |
| WO | WO 2020/093258 | * | 5/2020 |

OTHER PUBLICATIONS

Machine translation of the claims of CN 111019357 (no date).*
Machine translation of the specification of CN 111019357 (no date).*
Machine translation of JP 2017-125138 into English (no date).*
Jun. 15, 2021 Written Opinion of the International Searching Authority issued in International Patent Application No. PCT/JP2021/014460 (English Translation).
Jun. 15, 2021 International Search Report issued in International Patent Applicatio No. PCT/JP2021/014460.
Aug. 16, 2022 Office Action issued in Chinese Application No. 202180002827.4.

* cited by examiner

*Primary Examiner* — Marc S Zimmer
(74) *Attorney, Agent, or Firm* — Oliff PLC

(57) ABSTRACT

A thermally conductive resin composition capable of maintaining high thermal conductivity and a thermally conductive sheet using the same. A thermally conductive resin composition contains: an addition reaction type silicone resin; a hindered phenol-based antioxidant; a thiol-based antioxidant; a dispersant having a hydrophilic functional group and a silicone chain; and a thermally conductive filler, wherein the thermally conductive resin composition contains 65 to 90% by volume of the thermally conductive filler.

16 Claims, No Drawings

THERMALLY CONDUCTIVE RESIN COMPOSITION AND THERMALLY CONDUCTIVE SHEET USING THE SAME

TECHNICAL FIELD

The present technology relates to a thermally conductive resin composition and a thermally conductive sheet using the same. This application claims priority based on Japanese Patent Application No. 2020-78248, filed Apr. 27, 2020, in Japan, which is incorporated herein by reference.

BACKGROUND ART

In recent years, as the power density of semiconductor devices increases, materials used in the devices are required to have more excellent heat dissipation characteristics. In order to achieve more excellent heat dissipation characteristics, there is used a material called a thermal interface material, in various forms such as a sheet, a gel, and a grease, for reducing the thermal resistance of a path for releasing heat generated by a semiconductor element to a heat sink or a housing.

Generally, examples of the thermal interface material include, for example, a composite material (a thermally conductive resin composition) in which a thermally conductive filler is dispersed in an epoxy resin or a silicone resin. As the thermally conductive filler, metal oxides and metal nitrides are often used. Further, silicone resin, which is an example of the resin, is widely used from the viewpoint of heat resistance and flexibility.

In recent years, high thermal conductivity has been required for a thermally conductive sheet due to high-density mounting of a semiconductor element or the like and an increase in heat generation. To solve this problem, for example, it is conceivable to increase the amount of the thermally conductive filler in the thermally conductive resin composition.

However, in a thermally conductive resin composition containing, for example, an addition reaction type silicone resin as a binder component, an impurity (e.g., ionic components, organic compounds containing elements such as N, P, and S, and metals such as Sn, Pb, Hg, Sb, Bi, and As) in the thermally conductive filler tends to inhibit a catalyst (e.g., a platinum catalyst) reaction used for the addition reaction of the addition reaction type silicone resin.

Therefore, when the content of the thermally conductive filler in the thermally conductive resin composition containing the addition reaction type silicone resin as a binder component increases, the addition reaction type silicone resin tends not to be cured sufficiently, and in addition, the content of the addition reaction type silicone resin relatively decreases, so that the oxidizing action of the addition reaction type silicone resin tends to proceed under a high temperature environment. Due to this oxidizing action, for example, in a thermally conductive sheet using a thermally conductive resin composition, initial flexibility is lost during long-term use at a high temperature, and adhesion of a contact surface with a heat source tends to decrease, so that contact resistance might increase to degrade the essential performance of the thermally conductive sheet.

Therefore, in a thermally conductive resin composition containing an addition reaction type silicone resin as a binder component, in order to suppress the oxidizing action of the addition reaction type silicone resin under a high temperature environment while maintaining the flexibility when the thermally conductive resin composition is formed into a sheet, the upper limit of the content of the thermally conductive filler in the thermally conductive resin composition is limited to such an extent that the thermal conductivity of the thermally conductive sheet composed of the cured product of the thermally conductive resin composition exhibits about 3 W/m*K.

CITATION LIST

Patent Literature

Patent Document 1: International Publication No. WO 2017/002474
Patent Document 2: Japanese Patent No. 6008706
Patent Document 3: Japanese Patent No. 6194861

SUMMARY OF INVENTION

Technical Problem

In view of such conventional circumstances, an object of the present technology is to provide a thermally conductive resin composition capable of maintaining high thermal conductivity and a thermally conductive sheet using the same.

Solution to Problem

As a result of intensive studies, the present inventors have found that the above-mentioned problem can be solved by using, in a thermally conductive resin composition containing an addition type silicone resin and a thermally conductive filler, an antioxidant having a specific structure and a dispersant having a specific structure in combination.

A thermally conductive resin composition according to the present technology contains: an addition reaction type silicone resin; a hindered phenol-based antioxidant; a sulfur-based antioxidant; a dispersant having a hydrophilic functional group and a silicone chain; and a thermally conductive filler, wherein the thermally conductive resin composition contains 65 to 90% by volume of the thermally conductive filler.

A thermally conductive resin composition contains an addition reaction type silicone resin; a hindered phenol-based antioxidant; a sulfur-based antioxidant; a dispersant having a hydrophilic functional group and a silicone chain; and a thermally conductive filler, wherein the thermally conductive resin composition exhibits a thermal conductivity of 2.5 W/m*K or more after curing.

A thermally conductive sheet according to the present technology comprises a cured product of the above-described thermally conductive resin composition.

Advantageous Effects of Invention

According to this technology, it is possible to provide a thermally conductive resin composition capable of maintaining high thermal conductivity and a thermally conductive sheet using the same.

DESCRIPTION OF EMBODIMENTS

Thermally Conductive Resin Composition

A thermally conductive resin composition according to the present technology contains: an addition reaction type silicone resin; a hindered phenol-based antioxidant; a sulfur-based antioxidant; a dispersant having a hydrophilic functional group and a silicone chain; and a thermally conductive filler, wherein the thermally conductive resin composition contains 65 to 90% by volume of the thermally conductive filler.

Addition Reaction Type Silicone Resin

The thermally conductive resin composition according to the present technology uses a silicone resin as a binder resin because it has excellent moldability and weather resistance, as well as good adhesiveness and followability to electronic components. In particular, from the viewpoint of improving moldability, weather resistance, and adhesion, it is preferable to use a silicone resin comprising a main agent of a liquid silicone gel and a curing agent. Examples of such silicone resins include an addition reaction type silicone resin, a heat vulcanization type millable silicone resin (millable rubber) using a peroxide for vulcanization. In particular, when the thermally conductive resin composition is applied to a thermally conductive sheet to be sandwiched between a heat-generating element and a heat dissipating member, because adhesion between, for example, a heat-generating surface of an electronic component and a heat sink surface is required, an addition reaction type silicone resin (addition reaction type liquid silicone resin) is preferable.

Examples of the addition reaction type silicone resin include a two-part addition reaction type silicone resin containing (i) a silicone having an alkenyl group as a main component, (ii) a main agent containing a curing catalyst, and (iii) a curing agent having a hydrosilyl group (Si—H group).

(i) As the silicone having an alkenyl group, for example, a polyorganosiloxane having a vinyl group can be used. (ii) The curing catalyst is a catalyst for promoting the addition reaction between (i) an alkenyl group in the silicone having the alkenyl group and (iii) a hydrosilyl group in the curing agent having the hydrosilyl group. (ii) Examples of the curing catalyst includes a catalyst known as a catalyst used in the hydrosilylation reaction such as a platinum group-based curing catalyst such as a single platinum group metal such as platinum, rhodium, and palladium or platinum chloride. (iii) Examples of the curing agent having a hydrosilyl group includes a polyorganosiloxane having a hydrosilyl group.

As the addition reaction type silicone resin, a desirable commercially available product can be used in consideration of hardness of the cured product obtained by curing the thermally conductive resin composition. Examples include CY52-276, CY52-272, EG-3100, EG-4000, EG-4100, 527 (all of the above manufactured by Dow Corning Toray), KE-1800T, KE-1031, KE-1051J (all of the above manufactured by Shin-Etsu Chemical). The addition reaction type silicone resin may be used alone or in combination of two or more.

Antioxidant

The thermally conductive resin composition according to the present technology uses, as the antioxidant, a hindered phenol-based antioxidant as a primary antioxidant and a sulfur-based antioxidant as a secondary antioxidant in combination. The hindered phenol-based antioxidant captures, for example, radicals (peroxy radicals) to prevent oxidative deterioration of the addition reaction type silicone resin. The sulfur-based antioxidant decomposes, for example, a hydrooxide radical to suppress oxidative deterioration of the addition reaction type silicone resin.

Hindered Phenol-Based Antioxidant

Examples of the hindered phenol-based antioxidant include a one having a structure represented by the following Formula 1 as a hindered phenol skeleton. The hindered phenol-based antioxidant preferably has one or more skeletons represented by Formula 1, and may have two or more skeletons represented by Formula 1.

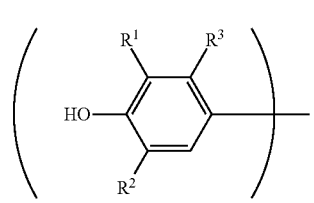

Formula 1

In Formula 1, it is preferable that $R^1$ and $R^2$ represent a t-butyl group, and $R^3$ represents a hydrogen atom (hindered type), or $R^1$ represents a methyl group, $R^2$ represents a t-butyl group, and $R^3$ represents a hydrogen atom (semi-hindered type), or R represents a hydrogen atom, $R^2$ represents a t-butyl group, and $R^3$ represents a methyl group (lesshindered type). From the viewpoint of long-term thermal stability under a high temperature environment, a semi-hindered type or a hindered type is preferable. The hindered phenol-based antioxidant preferably has three or more skeletons represented by Formula 1 described above in one molecule, wherein the three or more skeletons represented by Formula 1 are connected by a hydrocarbon group or a group consisting of a combination of a hydrocarbon group, —O—, and —CO—. The hydrocarbon groups may be linear, branched, or cyclic. The carbon number of the hydrocarbon group can be, for example, 3 to 8. The molecular weight of the hindered phenol-based antioxidant may be, for example, 300 to 850 or 500 to 800.

The hindered phenol-based antioxidant preferably has an ester bond in its structure. Using a hindered phenol-based antioxidant having an ester bond can prevent oxidation of the addition reaction type silicone resin more effectively. Examples of such phenol-based antioxidants include 3-(3, 5-di-tert-butyl-4-hydroxyphenyl) propionic acid stearyl, tetrakis [3-(3',5'-di-t-butyl-4'-hydroxyphenyl) propionic acid] pentaerythritol, and 2,2'-dimethyl-2,2'-(2,4,8,10-tetraoxaspiro [5.5] undecane-3,9-diyl) dipropane-1,1'-diyl=bis [3-(3-tert-butyl-4-hydroxy-5-methylphenyl) propanoate], among others. As the hindered phenol-based antioxidant, it is possible to use a compound having no ester bond in its structure, for example, 1,1,3-tris (2-methyl-4-hydroxy-5-t-butylphenyl) butane.

Commercially available phenol-based antioxidants include Adekastab AO-30, Adekastab AO-50, Adekastab AO-60, Adekastab AO-80 (all of the above manufactured by ADEKA), Irganox 1010, Irganox 1035, Irganox 1076, Irganox 1135 (all of the above manufactured by BASF). The phenol-based antioxidant may be used alone or in combination of two or more.

The lower limit of the content of the phenol-based antioxidant may be, for example, 0.1 parts by weight or more, preferably 0.5 parts by weight or more, with respect to 100 parts by weight of the addition reaction type silicone resin. The upper limit of the content of the phenol-based antioxidant may be, for example, 10 parts by weight or less, preferably 5 parts by weight or less, with respect to 100 parts by weight of the addition reaction type silicone resin. When two or more kinds of phenol-based antioxidants are used in combination, it is preferable that the total amount thereof satisfies the above content range.

Sulfur-Based Antioxidant

Examples of the sulfur-based antioxidant include a type having a thioether skeleton and a type having a hindered phenol skeleton. Examples of the sulfur-based antioxidant include 3,3'-thiobispropionic acid ditridecyl, tetrakis [3-(dodecylthio) propionic acid] pentaerythritol, 4,6-bis (octyl-thiomethyl)-o-cresol.

Commercially available sulfur-based antioxidants include Adekastab AO-412S, Adekastab AO-503, Adekastab AO-26 (all of the above manufactured by ADEKA), Sumilizer TP-D (manufactured by Sumitomo Chemical), Irganox 1520L (manufactured by BASF Japan). Among these sulfur-based antioxidants, from the viewpoint of less curing inhibition, it is preferable to use tetrakis [3-(dodecylthio) propionic acid] pentaerythritol (commercially available products: Adekastab AO-412S, Sumilizer TP-D (manufactured by Sumitomo Chemical), and Irganox 1520L. The sulfur-based antioxidant may be used alone or in combination of two or more.

The content of the sulfur-based antioxidant in the thermally conductive resin composition is preferably about the same as or larger than that of the phenol-based antioxidant. For example, the lower limit of the content of the sulfur-based antioxidant may be, for example, 0.1 parts by weight or more with respect to 100 parts by weight of the addition reaction type silicone resin. The upper limit of the content of the sulfur-based antioxidant may be, for example, 20 parts by weight or less, preferably 10 parts by weight or less with respect to 100 parts by weight of the addition reaction type silicone resin. When two or more kinds of sulfur-based antioxidants are used in combination, it is preferable that the total amount thereof satisfies the above content range.

Dispersant

The thermally conductive resin composition according to the present technology contains a dispersant having a hydrophilic functional group and a silicone chain (hereinafter also referred to as a "dispersant having a specific structure"). Such a dispersant having a specific structure can more effectively suppress oxidation of the thermally conductive sheet as compared with a general silicone compound (for example, alkylalkoxysilanes) used as a dispersant such as a silane coupling agent or a silane agent, thereby further contributing the heat resistance of the thermally conductive sheet.

Examples of the dispersant having a specific structure include a silicone compound which is a copolymer having a silicone chain (silicone skeleton) and a hydrophilic functional group, and a modified product of a silicone compound having a silicone chain and a hydrophilic functional group. The dispersant having a specific structure may have a hydrophilic functional group such as a carboxy group, an epoxy group, a carbonyl group, a hydroxyl group, or an ether group, or may have a structure containing a hydrophilic functional group (hydrophilic structure). Examples of the structure containing the hydrophilic functional group include a polyglycerin chain and a polyether chain. The silicone chain may be linear or branched.

Examples of the dispersant having a specific structure include silicone compounds such as a polyether-modified silicone-based compound, a polyglycerin-modified silicone-based compound, a polyetheracrylic-modified silicone-based compound, a polyglycerin acrylic-modified silicone-based compound, and an acrylic silicone-based compound. Among these dispersants having a specific structure, polyglycerin-modified silicone type and acrylic silicone type compounds are preferable in terms of the dispersibility and the heat resistance contribution when the thermally conductive resin composition is formed into a thermally conductive sheet. Examples of the polyglycerin-modified silicone type compound include polyglyceryl-3 polydimethylsiloxyethyl dimethicone. Examples of the acrylic silicone type compound include a graft copolymer composed of an acrylic polymer and dimethylpolysiloxane, a stearyl-modified acrylate silicone, and an alkyl acrylate copolymer methylpolysiloxane ester. Commercially available dispersions having a specific structure include KP-541, KP-561P, KP-574, KP-578, KF-6106 (all of the above manufactured by Shin-Etsu Silicone), SYMAC (registered trademark) US-350 (manufactured by TOAGOSEI). The dispersant having a specific structure may be used alone or in combination of two or more.

The lower limit of the content of the dispersant of the specific structure may be, for example, 0.1 parts by weight or more, preferably 0.3 parts by weight or more with respect to 100 parts by weight of the thermally conductive filler. The upper limit of the content of the dispersant of the specific structure may be, for example, 2 parts by weight or less, preferably 1 part by weight or less with respect to 100 parts by weight of the thermally conductive filler. When two or more kinds of dispersants having a specific structure are used in combination, it is preferable that the total amount thereof satisfies the above content range.

Thermally Conductive Filler

In view of desired thermal conductivity and fillability, the thermally conductive filler may be selected from known materials including metal hydroxides such as aluminum hydroxide and magnesium hydroxide, metals such as aluminum, copper, and silver, metal oxides such as alumina and magnesium oxide, metal nitrides such as aluminum nitride, boron nitride, and silicon nitride, carbon nanotubes, metallic silicon, and fiber fillers (glass fiber and carbon fiber). The thermally conductive filler may be used alone or in combination of two or more.

The thermally conductive resin composition according to the present technology preferably contains a nitride as a thermally conductive filler from the viewpoint of achieving, for example, an excellent flame retardancy. The nitride is preferably a metal nitride, and more preferably aluminum nitride. The thermally conductive resin composition according to the present technology may contain, as a thermally conductive filler, at least one of aluminum nitride, metal hydroxide, metal oxide, and carbon fiber. Examples of the metal hydroxide and the metal oxide include aluminum hydroxide, alumina, aluminum nitride, and magnesium oxide. For example, as the thermally conductive filler, only alumina, only aluminum nitride, or only carbon fibers may be used. In particular, in the thermally conductive resin composition according to the present technology, it is preferable to use, as the thermally conductive filler, a mixture of aluminum nitride, alumina, and magnesium oxide from the viewpoints of flame retardancy and heat conductivity, and this mixture may further contain carbon fibers.

The content of the thermally conductive filler in the thermally conductive resin composition can be appropriately determined according to a desired thermal conductivity or the like, and the volume content in the thermally conductive resin composition can be 65 to 90% by volume. When the content of the thermally conductive filler in the thermally conductive resin composition is less than 65% by volume, the thermal conductivity tends to be insufficient. When the content of the thermally conductive filler in the thermally conductive resin composition exceeds 90% by volume, the filling of the thermally conductive filler tends to be difficult. The content of the thermally conductive filler in the thermally conductive resin composition may be 70% by volume or more or 85% by volume or less. When two or more kinds of thermally conductive fillers are used in combination, the total amount thereof preferably satisfies the above content range.

When the thermally conductive filler contains aluminum nitride, the content of aluminum nitride in the thermally conductive filler may be 1 to 100% by volume.

As described above, the thermally conductive resin composition according to the present technology contains: an addition reaction type silicone resin; a hindered phenol-based antioxidant; a sulfur-based antioxidant; a dispersant having a specific structure; and a thermally conductive filler, wherein the thermally conductive resin composition contains 65 to 90% by volume of the thermally conductive filler. Thus, by using the addition reaction type silicone resin, a dispersant having a hydrophilic functional group and a silicone chain, a hindered phenol-based antioxidant, and a sulfur-based antioxidant in combination, the oxidation deterioration of the addition reaction type silicone resin can be more effectively prevented by the synergistic effect, and high thermal conductivity can be maintained when the thermally conductive resin composition is formed into a thermally conductive sheet. Further, although the thermally conductive resin composition according to the present technology contains 65 to 90% by volume of the thermally conductive filler, it is possible to suppress the oxidizing action of the addition reaction type silicone resin under a high temperature environment while maintaining the flexibility when the thermally conductive resin composition is formed into a sheet.

In addition, the thermally conductive resin composition according to the present technology may contain: an addition reaction type silicone resin; a hindered phenol-based antioxidant; a sulfur-based antioxidant; a dispersant having a hydrophilic functional group and a silicone chain; and a thermally conductive filler, wherein the thermally conductive resin composition may exhibit a thermal conductivity of 2.5 W/m*K or more after curing. Such an embodiment can also achieve the effect of the present technology.

It should be noted that the thermally conductive resin composition according to the present technology may further contain components other than the above components within a range not impairing the effect of the present technology. For example, the thermally conductive resin composition according to the present technology may contain, as an antioxidant, a phosphorus-based antioxidant in addition to the sulfur-based antioxidant described above. However, the phosphorus-based antioxidant tends to inhibit the curing reaction of the addition reaction type silicone resin when the thermally conductive filler is highly filled in the thermally conductive resin composition. Therefore, the thermally conductive resin composition according to the present technology preferably does not substantially contain the phosphorus-based antioxidant, or for example, the content of the phosphorus-based antioxidant is preferably 1% by mass or less.

The thermally conductive resin composition according to the present technology can be obtained, for example, by kneading the above-mentioned components using a kneader (such as a planetary mixer, a ball mill, and a Henschel mixer). In a case where a two-component addition reaction type silicone resin is used as the addition reaction type silicone resin that is a binder resin, instead of mixing the main agent, the curing agent, and the thermally conductive filler at the same time, a required amount of the thermally conductive filler may be divided and mixed into the main agent and the curing agent respectively, and the component containing the main agent and the component containing the curing agent may be mixed at the time of use.

Thermally Conductive Sheet

The thermally conductive sheet according to the present technology comprises a cured product of the thermally conductive resin composition described above. By using the aforementioned thermally conductive resin composition, the thermally conductive sheet according to the present technology can have a thermal conductivity of 3.0 W/m*K or higher, 3.5 W/m*K or higher, 4.0 W/m*K or higher, 4.5 W/m*K or higher, and 5.0 W/m*K or higher. The upper limit value of the thermal conductivity of the thermally conductive sheet is not particularly limited, but may be, for example, 7.0 W/m*K or less.

Further, in the thermally conductive sheet according to the present technology, when aged at 200° C. for 24 hours, the maintenance rate of the thermal conductivity represented by the following Formula 2 can be 70% or more, 75% or more, 80% or more, and 90% or more.

Formula 2:
(thermal conductivity of thermally conductive sheet after aging treatment/thermal conductivity of thermally conductive sheet before aging treatment)×100.

The thermally conductive sheet according to the present technology can be obtained by applying a thermally conductive resin composition with a desired thickness on a release film formed of, for example, PET (polyethylene terephthalate), PEN (polyethylene naphthalate), polyolefin, polymethylpentene, glassine paper, or the like, and heating the composition to cure the binder resin (addition reaction type silicone resin). The thickness of the thermally conductive sheet can be appropriately selected according to the purpose, and it may be, for example, 0.05 to 5 mm.

As described above, since the thermally conductive sheet according to the present technology contains the above-described thermally conductive resin composition, the oxidative deterioration of the addition-reactive silicone resin can be more effectively prevented by the synergistic effect of the addition-reactive silicone resin, the dispersant having a hydrophilic functional group and a silicone chain, the hindered phenol-based antioxidant, and the sulfur-based antioxidant, and high thermal conductivity can be maintained. Further, although the thermally conductive sheet according to the present technology is made of a thermally conductive resin composition containing 65 to 90% by volume of a thermally conductive filler, it is possible to suppress the oxidizing action of the addition reaction type silicone resin under a high temperature environment while maintaining the flexibility.

In the heat radiation structure according to the present technology, a cured product of the above-described thermally conductive resin composition such as a thermally conductive sheet, is sandwiched between a heat-generating element and a heat dissipating member. Examples of the heat-generating element include an integrated circuit element such as a CPU (Central Processing Unit), a GPU (Graphics Processing Unit), a DRAM (Dynamic Random Access Memory), and a flash memory, and electronic components such as a transistor and a resistor that generate heat in an electric circuit. The heat-generating element also includes a component for receiving an optical signal such as an optical transceiver in a communication device. Examples of the heat dissipating member include a heat sink, a heat spreader used in combination with an integrated circuit element, a transistor, and an optical transceiver housing, among others. Further, the housing itself accommodating an electric circuit may be used as a heat dissipating member. In the heat radiation structure according to the present technology, for example, cured products of the above-described thermally conductive resin composition, particularly thermally conductive sheets, may be sandwiched between the integrated circuit element and the heat spreader, and between the heat spreader and the heat sink, respectively.

An article according to the present technology includes the above-described heat dissipating structure. Examples of the article having the heat dissipating structure include: a personal computer; a server device; a mobile phone; a radio base station; an engine, a power transmission system, and a steering system of a transportation machine such as an automobile; and an ECU (Electronic Control Unit) used for controlling electric components such as an air conditioner.

EXAMPLES

Examples of the present technology will be described below. In these Examples, thermally conductive resin compositions were prepared by using the materials shown in Table 1. The thermally conductive sheets obtained from the thermally conductive resin composition were subjected to the tests shown in Tables 1 and 2. The present technology is not limited to the following examples.
Preparation of Thermally Conductive Resin Composition
The materials used in Examples are as follows.
Addition Type Silicone Resin
silicone resin A (product name: CY52-276A (manufactured by Dow Corning Toray))
silicone resin B (product name: CY52-276B (manufactured by Dow Corning Toray))
Dispersant
graft copolymer of acrylic polymer and dimethylpolysiloxane (product name: KP-561P (manufactured by Shin-Etsu Silicone))
graft copolymer of acrylic polymer and dimethylpolysiloxane (product name: KP-578 (manufactured by Shin-Etsu Silicone))
polyglycerin-modified silicone surfactant with branched silicone chains (product name: KF-6106 (manufactured by Shin-Etsu Silicone))
alkyltrialkoxysilane (product name: Z-6210 (manufactured by Dow Corning Toray))
Antioxidant
phenol-based antioxidant (product name: AO-80 (manufactured by ADEKA))
phenol-based antioxidant (product name: AO-30 (manufactured by ADEKA))
sulfur-based antioxidant (product name: SUMILIZER (registered trademark) TP-D (manufactured by Sumitomo Chemical))
sulfur-based antioxidant (product name: Irganox 1520L (manufactured by BASF Japan))
Thermally Conductive Filler
mixture of aluminum nitride, alumina (spherical alumina), and magnesium oxide Examples 1 to 3 and Comparative Examples 1 to 8

As a thermally conductive filler, with respect to 100 parts by weight of the silicone resin, 550 parts by weight of aluminum nitride, 365 parts by weight of alumina, and 650 parts by weight of magnesium oxide were added one by one and stirred to form a mixture. A planetary mixer was used for stirring with the rotational speed at 1,200 rpm. Thereafter, the thermally conductive resin composition was applied to a thickness of 2 mm using a bar coater, and heated at 80° C. for 6 hours to prepare a thermally conductive sheet.

Examples 4 to 6

In Examples 4 to 6, a thermally conductive sheet was prepared in the same manner as in Example 1 except that the amount of the antioxidant was changed.

Example 7

In Example 7, a thermally conductive sheet was prepared in the same manner as in Example 1 except that, as the thermally conductive filler, with respect to 100 parts by weight of the silicone resin, 330 parts by weight of aluminum nitride, 220 parts by weight of alumina, and 385 parts by weight of magnesium oxide were added one by one and stirred to form a mixture.

Example 8

In Example 8, a thermally conductive sheet was prepared in the same manner as in Example 1 except that, as the thermally conductive filler, with respect to 100 parts by weight of the silicone resin, 219 parts by weight of aluminum nitride, 146 parts by weight of alumina, and 255 parts by weight of magnesium oxide were added one by one and stirred to form a mixture.

Example 9

In Example 9, a thermally conductive sheet was prepared in the same manner as in Example 1 except that, as the thermally conductive filler, with respect to 100 parts by weight of the silicone resin, 742 parts by weight of aluminum nitride, 495 parts by weight of alumina, and 866 parts by weight of magnesium oxide were added one by one and stirred to form a mixture.

Examples 10 and 11

In Examples 10 and 11, a thermally conductive sheet was prepared in the same manner as in Example 1 except that the type of antioxidant was changed.
Dispersibility
To a thermally conductive resin composition in which components other than thermally conductive fillers were mixed, thermally conductive fillers were added one by one and stirred. A commercially available planetary centrifugal mixer (planetary vacuum stirring deforming mixer (product name: V-mini 300, manufactured by EME)) was used for stirring with the rotational speed at 1,200 rpm. The time until the thermally conductive fillers were dispersed in the thermally conductive resin composition was evaluated. The results are shown in Table 1.
A: within 2 minutes
B: more than 2 minutes, within 4 minutes
C: more than 4 minutes, within 6 minutes
D: more than 6 minutes, within 10 minutes
E: not mixed at all even after stirring for more than 10 minutes
Initial Thermal Conductivity
The initial thermal conductivity (W/m*K) in the thickness direction of the thermally conductive sheet was measured under a load of 1 kgf/cm$^2$ using a thermal resistance measuring device conforming to ASTM-D5470. The sheet temperature at the time of measurement was 45° C. The results are shown in Tables 1 and 2.

Thermal conductivity after aging at 200° C. for 24 hours

The thermal conductivity (W/m*K) in the thickness direction of the thermally conductive sheet after the aging at 200° C. for 24 hours (super-acceleration test) was measured. The results are shown in Tables 1 and 2. In the tables, "—" indicates that evaluation was not possible.

Initial Thermal Conductivity Maintenance Rate

When the thermally conductive sheet deteriorates due to the aging treatment, the thermally conductive sheet hardens and the contact resistance of the sheet surface increases, so that the apparent thermal conductivity decreases. Therefore, from the viewpoint of thermal conductivity and flexibility of the thermally conductive sheet, it is preferable that the initial thermal conductivity maintenance rate is high. The initial thermal conductivity maintenance rate (%) was determined from the thermal conductivity of the thermally conductive sheet before the aging treatment (initial thermal conductivity) and the thermal conductivity of the thermally conductive sheet after the aging treatment, as shown in Formula 2 below. The results are shown in Tables 1 and 2. In the tables, "—" indicates that evaluation was not possible.

(thermal conductivity of thermally conductive sheet after aging treatment/thermal conductivity of thermally conductive sheet before aging treatment(initial thermal conductivity))×100   Formula 2:

TABLE 1

| | | Product | Ex.1 | Ex.2 | Ex.3 | Ex.4 | Ex.5 | Ex.6 | Ex.7 | Ex.8 | Ex.9 | Ex.10 | Ex.11 |
|---|---|---|---|---|---|---|---|---|---|---|---|---|---|
| Binder | addition-type silicone A | CY52-276A | 50.0 | 50.0 | 50.0 | 49.9 | 50.1 | 49.8 | 50.3 | 50.1 | 53.8 | 50.0 | 49.8 |
| | addition-type silicone B | CY52-276B | 50.0 | 50.0 | 50.0 | 50.1 | 49.9 | 50.2 | 49.7 | 49.9 | 46.2 | 50.0 | 50.2 |
| Dispersant | graft copolymer composed of acrylic polymer and dimethylpolysiloxane | KP-561P | 0 | 0 | 9.4 | 0 | 0 | 0 | 0 | 0 | 0 | 0 | 0 |
| | graft copolymer composed of acrylic polymer and dimethylpolysiloxane | KP-578 | 9.4 | 0 | 0 | 9.7 | 9.3 | 9.4 | 9.3 | 9.5 | 23.8 | 9.5 | 9.3 |
| | silicone surfactant using polyglycerin as hydrophilic part | KF-6106 | 0.0 | 9.4 | 0 | 0 | 0 | 0 | 0 | 0 | 0 | 0 | 0 |
| | alkyltrialkoxysilane | Z-6210 | 0 | 0 | 0 | 0 | 0 | 0 | 0 | 0 | 0 | 0 | 0 |
| Antioxidant | hindered phenol-based antioxidant | AO-80 | 0.6 | 0.6 | 0.6 | 0.6 | 0.7 | 0.6 | 0.7 | 0.6 | 0.6 | 0 | 0.6 |
| | | AO-30 | 0 | 0 | 0 | 0 | 0 | 0 | 0 | 0 | 0 | 0.6 | 0 |
| | thiol-based antioxidant | TP-D | 1.3 | 1.3 | 1.3 | 0.3 | 0.7 | 1.9 | 1.2 | 1.3 | 1.2 | 1.3 | 0 |
| | | Irganox 1520L | 0 | 0 | 0 | 0 | 0 | 0 | 0 | 0 | 0 | 0 | 1.3 |
| Thermally conductive filler | mixture of aluminum nitride, alumina, and magnesium oxide | | 1565 | 1565 | 1565 | 1563 | 1546 | 1552 | 935 | 620 | 2103 | 1564 | 1553 |
| | amount of thermally conductive filler (vol %) | | 80 | 80 | 80 | 80 | 80 | 80 | 70 | 65 | 85 | 80 | 80 |
| Composition evaluation | dispersibility | | B | B | C | B | B | B | B | B | C | B | B |
| Sheet evaluation | initial thermal conductivity (sheet temperature at the time of measurement: 45° C.) (W/m · K) | | 6.00 | 6.16 | 4.73 | 6.47 | 5.98 | 5.99 | 3.95 | 2.59 | 6.83 | 6.56 | 5.49 |
| | thermal conductivity after aging at 200° C. for 24 hours (super-acceleration test) (W/m · K) | | 4.50 | 4.30 | 4.40 | 4.67 | 4.40 | 4.44 | 3.25 | 2.44 | 5.02 | 5.60 | 4.80 |
| | initial thermal conductivity maintenance rate (%) | | 75 | 70 | 93 | 72 | 74 | 74 | 82 | 94 | 73 | 85 | 87 |

TABLE 2

| | | Product | Comp. 1 | Comp. 2 | Comp. 3 | Comp. 4 | Comp. 5 | Comp. 6 | Comp. 7 | Comp. 8 |
|---|---|---|---|---|---|---|---|---|---|---|
| Binder | addition-type silicone A | CY52-276A | 50.0 | 50.0 | 50.0 | 50.0 | 50.0 | 50.0 | 50.0 | 50.0 |
| | addition-type silicone B | CY52-276B | 50.0 | 50.0 | 50.0 | 50.0 | 50.0 | 50.0 | 50.0 | 50.0 |
| Dispersant | graft copolymer composed of acrylic polymer and dimethylpolysiloxane | KP-561P | 0 | 0 | 0 | 0 | 0 | 0 | 0 | 0 |
| | graft copolymer composed of acrylic polymer and dimethylpolysiloxane | KP-578 | 0 | 0 | 9.4 | 9.4 | 0 | 0 | 9.4 | 0 |
| | silicone surfactant using polyglycerin as hydrophilic part | KF-6106 | 0.0 | 0 | 0 | 0 | 0 | 0 | 0 | 0 |
| | alkyltrialkoxysilane | Z-6210 | 0 | 9.4 | 0 | 0 | 9.4 | 9.4 | 0 | 9.4 |
| Antioxidant | hindered phenol-based antioxidant | AO-80 | 0 | 0 | 0 | 0.6 | 0.6 | 0.6 | 0 | 0 |
| | thiol-based antioxidant | TP-D | 0 | 0 | 0 | 0 | 0 | 1.3 | 1.3 | 1.3 |
| Thermally conductive filler | mixture of aluminum nitride, alumina, and magnesium oxide | | 1565 | 1565 | 1565 | 1565 | 1565 | 1565 | 1565 | 1565 |
| | amount of thermally conductive filler (vol %) | | 80 | 80 | 80 | 80 | 80 | 80 | 70 | 65 |
| Composition evaluation | dispersibility | | E | A | B | B | A | A | B | A |
| Sheet evaluation | initial thermal conductivity (sheet temperature at the time of measurement: 45° C.) (W/m · K) | | — | 6.78 | 6.01 | 5.27 | 6.19 | 6.61 | 6.13 | 6.52 |
| | thermal conductivity after aging at 200° C. for 24 hours (super-acceleration test) (W/m · K) | | — | 0.81 | 2.06 | 2.24 | 1.67 | 2.80 | 3.00 | 0.82 |
| | initial thermal conductivity maintenance rate (%) | | — | 12 | 34 | 43 | 27 | 42 | 49 | 13 |

From Examples 1 to 11, it was found that, a thermally conductive sheet having an excellent initial thermal conductivity maintenance rate can be obtained from a thermally conductive resin composition containing an addition reaction type silicone resin, a hindered phenol-based antioxidant, a sulfur-based antioxidant, a dispersant having a hydrophilic functional group and a silicone chain, and 65 to 90% by volume of a thermally conductive filler. Thus, it has been found that the thermally conductive sheet obtained in Examples 1 to 11 can maintain high thermal conductivity and flexibility even in a high temperature environment.

In particular, even in Examples 1 to 6 and 9 to 11 in which the content of the thermally conductive filler in the thermally conductive resin composition is 80% by volume or more and the initial thermal conductivity of the thermally conductive sheet is 4.5 W/m*K or more, the initial thermal conductivity maintenance rate of the thermally conductive sheet was good.

On the contrary, in Comparative Example 1, in which the thermally conductive resin composition contains no hindered phenol-based antioxidant, sulfur-based antioxidant, and dispersant having hydrophilic functional group and silicone chain, the dispersibility of the composition was not good and it was difficult to form a thermally conductive sheet.

In Comparative Example 2, in which the thermally conductive resin composition contains no hindered phenol-based antioxidant, sulfur-based antioxidant, and dispersant having a hydrophilic functional group and a silicone chain, the initial thermal conductivity maintenance rate was not good.

In Comparative Example 3, in which the thermally conductive resin composition contains no hindered phenol-based antioxidant and sulfur-based antioxidant, the initial thermal conductivity maintenance rate was not good.

In Comparative Example 4, in which the thermally conductive resin composition contains no sulfur-based antioxidant, the initial thermal conductivity maintenance rate was not good.

In Comparative Example 5, in which the thermally conductive resin composition contains no sulfur-based antioxidant and a dispersant having a hydrophilic functional group and a silicone chain, the initial thermal conductivity maintenance rate was not good.

In Comparative Example 6, in which the thermally conductive resin composition contains no dispersant having a hydrophilic functional group and a silicone chain, the initial thermal conductivity maintenance rate was not good.

In Comparative Example 7, in which the thermally conductive resin composition contains no hindered phenol-based antioxidant, the initial thermal conductivity maintenance rate was not good.

In Comparative Example 8, in which the thermally conductive resin composition contains no hindered phenol-based antioxidant and dispersant having a hydrophilic functional group and a silicone chain, the initial thermal conductivity maintenance rate was not good.

The invention claimed is:

1. A thermally conductive resin composition containing:
an addition reaction type silicone resin;
a hindered phenol-based antioxidant;
a sulfur-based antioxidant;
a dispersant having a hydrophilic functional group and a silicone chain; and
a thermally conductive filler,
wherein the thermally conductive resin composition contains 65 to 90% by volume of the thermally conductive filler,
wherein the thermally conductive filler is a mixture of aluminum nitride, alumina, and magnesium oxide, and
wherein the composition contains 0.6 to 0.7 parts by weight of the hindered phenol-based antioxidant with respect to 100 parts by weight of the addition reaction type silicone resin, 0.3 to 1.9 parts by weight of the sulfur-based antioxidant with respect to 100 parts by weight of the addition reaction type silicone resin, and 9.3 to 23.8 parts by weight of the dispersant having a hydrophilic functional group and a silicone chain with respect to 100 parts by weight of the addition reaction type silicone resin.

2. The thermally conductive resin composition according to claim 1, wherein the hindered phenol-based antioxidant has a structure represented by Formula 1:

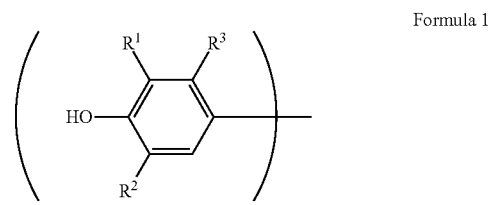

Formula 1 wherein, in Formula 1,
$R^1$ and $R^2$ represent a t-butyl group, and $R^3$ represents a hydrogen atom; or
$R^1$ represents a methyl group, $R^2$ represents a t-butyl group, and $R^3$ represents a hydrogen atom; or
$R^1$ represents a hydrogen atom, $R^2$ represents a t-butyl group, and $R^3$ represents a methyl group.

3. The thermally conductive resin composition according to claim 1, wherein the hindered phenol-based antioxidant is a hindered phenol-based antioxidant having an ester bond.

4. The thermally conductive resin composition according to claim 1, wherein the dispersant contains at least one silicone compound selected from a group of polyether-modified silicone-based compound, a polyglycerin-modified silicone-based compound, a polyetheracrylic-modified silicone-based compound, a polyglycerin acrylic-modified silicone-based compound, and an acrylic silicone-based compound.

5. A thermally conductive resin composition containing:
an addition reaction type silicone resin;
a hindered phenol-based antioxidant;
a sulfur-based antioxidant;
a dispersant having a hydrophilic functional group and a silicone chain; and
a thermally conductive filler,
wherein the thermally conductive resin composition exhibits a thermal conductivity of 2.5 W/m*K or more after curing,
wherein the thermally conductive filler is a mixture of aluminum nitride, alumina, and magnesium oxide, and
wherein the composition contains 0.6 to 0.7 parts by weight of the hindered phenol-based antioxidant with respect to 100 parts by weight of the addition reaction type silicone resin, 0.3 to 1.9 parts by weight of the sulfur-based antioxidant with respect to 100 parts by weight of the addition reaction type silicone resin, and 9.3 to 23.8 parts by weight of the dispersant having a hydrophilic functional group and a silicone chain with respect to 100 parts by weight of the addition reaction type silicone resin.

6. A thermally conductive sheet comprising a cured product of the thermally conductive resin composition according to claim 1.

7. The thermally conductive sheet according to claim 6, wherein the thermally conductive sheet has a thermal conductivity of 4.5 W/m*K or more.

8. The thermally conductive sheet according to claim 6, wherein the maintenance rate of the thermal conductivity represented by Formula 2 is 70% or more when aged at 200° C. for 24 hours:

$$(\text{thermal conductivity of thermally conductive sheet after aging treatment/thermal conductivity of thermally conductive sheet before aging treatment}) \times 100. \quad \text{Formula 2:}$$

9. A heat dissipating structure in which a cured product of the thermally conductive resin composition according to claim 1 is sandwiched between a heat-generating element and a heat dissipating member.

10. A heat dissipating structure in which the thermally conductive sheet according to claim 6 is sandwiched between a heat-generating element and a heat dissipating member.

11. An article comprising a heat dissipating structure according to claim 9.

12. The thermally conductive resin composition according to claim 2, wherein the hindered phenol-based antioxidant is a hindered phenol-based antioxidant having an ester bond.

13. The thermally conductive resin composition according to claim 2, wherein the dispersant contains at least one silicone compound selected from a group of polyether-modified silicone-based compound, a polyglycerin-modified silicone-based compound, a polyetheracrylic-modified silicone-based compound, a polyglycerin acrylic-modified silicone-based compound, and an acrylic silicone-based compound.

14. The thermally conductive resin composition according to claim 3, wherein the dispersant contains at least one silicone compound selected from a group of polyether-modified silicone-based compound, a polyglycerin-modified silicone-based compound, a polyetheracrylic-modified silicone-based compound, a polyglycerin acrylic-modified silicone-based compound, and an acrylic silicone-based compound.

15. The thermally conductive resin composition according to claim 1, wherein the sulfur-based antioxidant is an antioxidant with a thioether skeleton.

16. The thermally conductive resin composition according to claim 5, wherein the sulfur-based antioxidant is an antioxidant with a thioether skeleton.

* * * * *